United States Patent
Shiraiwa

(10) Patent No.: US 10,304,718 B2
(45) Date of Patent: May 28, 2019

(54) ELECTROSTATIC CHUCK DEVICE

(71) Applicant: SHINKO ELECTRIC INDUSTRIES CO., LTD., Nagano-shi, Nagano-ken (JP)

(72) Inventor: Norio Shiraiwa, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 272 days.

(21) Appl. No.: 15/248,774

(22) Filed: Aug. 26, 2016

(65) Prior Publication Data

US 2017/0069519 A1   Mar. 9, 2017

(30) Foreign Application Priority Data

Sep. 3, 2015 (JP) ................... 2015-174051

(51) Int. Cl.
*H01L 21/683* (2006.01)
*H01L 21/687* (2006.01)

(52) U.S. Cl.
CPC .... *H01L 21/68757* (2013.01); *H01L 21/6831* (2013.01)

(58) Field of Classification Search
CPC ............... H01L 21/68757; H01L 21/6831
See application file for complete search history.

(56) References Cited

U.S. PATENT DOCUMENTS

| | | | | |
|---|---|---|---|---|
| 5,529,657 A | * | 6/1996 | Ishii | H01J 37/321 118/723 E |
| 5,740,009 A | * | 4/1998 | Pu | H01L 21/6831 361/234 |
| 5,942,039 A | * | 8/1999 | Kholodenko | H01J 37/32642 118/723 E |
| 2003/0198749 A1 | * | 10/2003 | Kumar | C04B 41/009 427/376.3 |
| 2011/0006037 A1 | * | 1/2011 | Satoh | C23C 8/36 216/57 |
| 2011/0180983 A1 | * | 7/2011 | Arun | H01J 37/32495 269/86 |
| 2016/0343547 A1 | * | 11/2016 | Lim | H01J 37/32642 |

FOREIGN PATENT DOCUMENTS

JP    2003-179129 A    6/2003

* cited by examiner

*Primary Examiner* — Zeev V Kitov
(74) *Attorney, Agent, or Firm* — Tarolli, Sundheim, Covell & Tummino LLP

(57) ABSTRACT

An electrostatic chuck device includes a base plate, an electrostatic chuck plate coupled to an upper surface of the base plate and including a mount region on which an attraction subject is mounted, an electrostatic electrode embedded in the chuck plate, a focus ring that is located on the upper surface of the base plate and covers an outer side surface and a portion of an upper surface of the chuck plate. A groove is located in the upper surface of the chuck plate at a portion that corresponds to a region between the focus ring and the mount region in a plan view. The groove is filled with a protective layer. The groove is located at a position separated from the electrostatic electrode in a plan view. The protective layer is formed from a material having a higher plasma resistance than a material forming the chuck plate.

8 Claims, 4 Drawing Sheets

10,304,718 B2

ELECTROSTATIC CHUCK DEVICE

CROSS-REFERENCE TO RELATED APPLICATIONS

This application is based upon and claims the benefit of priority from prior Japanese Patent Application No. 2015-174051, filed on Sep. 3, 2015, the entire contents of which are incorporated herein by reference.

FIELD

This application relates to an electrostatic chuck device and a method for manufacturing an electrostatic chuck device.

BACKGROUND

A plasma etching device is known as a device used to manufacture semiconductor elements. The plasma etching device includes a stage that holds a substrate (e.g., silicon wafer) in a processing chamber under reduced pressure. As one example of such a stage, Japanese Laid-Open Patent Publication No. 2003-179129 describes an electrostatic chuck device that electrostatically attracts and holds a substrate on a holding base.

FIG. 7 illustrates an electrostatic chuck device 80 in the related art. The electrostatic chuck device 80 includes a base plate 81, an electrostatic chuck (ESC) plate 83, and a focus ring 84. The electrostatic chuck plate 83 is bonded to an upper surface of the base plate 81 by an adhesive layer 82. The focus ring 84 is fixed to an upper surface of the base plate 81 to cover a side surface of the electrostatic chuck plate 83 and a portion of the upper surface of the electrostatic chuck plate 83. The electrostatic chuck plate 83 embeds electrostatic electrodes 85 which attract a substrate W that is an attraction subject. The substrate W is mounted on an attraction surface 83A (here, upper surface) of the electrostatic chuck plate 83 that is exposed from the focus ring 84. Application of DC voltage to the electrostatic electrodes 85 from an external power supply generates electrostatic force. The electrostatic force attracts and holds the substrate W on the attraction surface 83A of the electrostatic chuck plate 83.

When the substrate W, which is attracted to and held on the attraction surface 83A of the electrostatic chuck plate 83, repeatedly undergoes a plasma processing using a highly corrosive processing gas, the plasma irradiation corrodes the attraction surface 83A exposed from a gap between the focus ring 84 and the substrate W. The corroded surface adversely affects the heat transmission property and decreases the attraction force. This shortens the life of the electrostatic chuck device 80.

SUMMARY

One embodiment of an electrostatic chuck device includes a base plate, an electrostatic chuck plate coupled to an upper surface of the base plate and including a mount region on which an attraction subject is mounted, an electrostatic electrode embedded in the electrostatic chuck plate, a focus ring that is located on the upper surface of the base plate and covers an outer side surface of the electrostatic chuck plate and a portion of an upper surface of the electrostatic chuck plate, a groove located in the upper surface of the electrostatic chuck plate at a portion that corresponds to a region between the focus ring and the mount region in a plan view, and a protective layer with which the groove is filled. The groove is located at a position separated from the electrostatic electrode in a plan view. The protective layer is formed from a material having a higher plasma resistance than a material forming the electrostatic chuck plate.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1A:
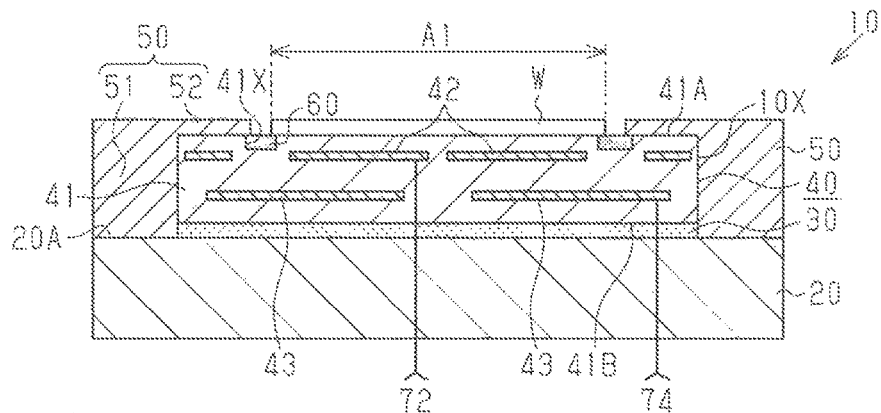
FIG. 1A is a schematic cross-sectional view illustrating a first embodiment of an electrostatic chuck device and taken along line 1-1 in FIG. 2.

Each embodiment will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings.

First Embodiment

A first embodiment will now be described with reference to FIGS. 1A to 4B.

As illustrated in FIG. 1A, an electrostatic chuck device 10 includes a base plate 20, an adhesive layer 30, an electrostatic chuck (ESC) plate 40, and a focus ring 50. The electrostatic chuck plate 40 is bonded to an upper surface 20A of the base plate 20 by the adhesive layer 30.

Figure 2:
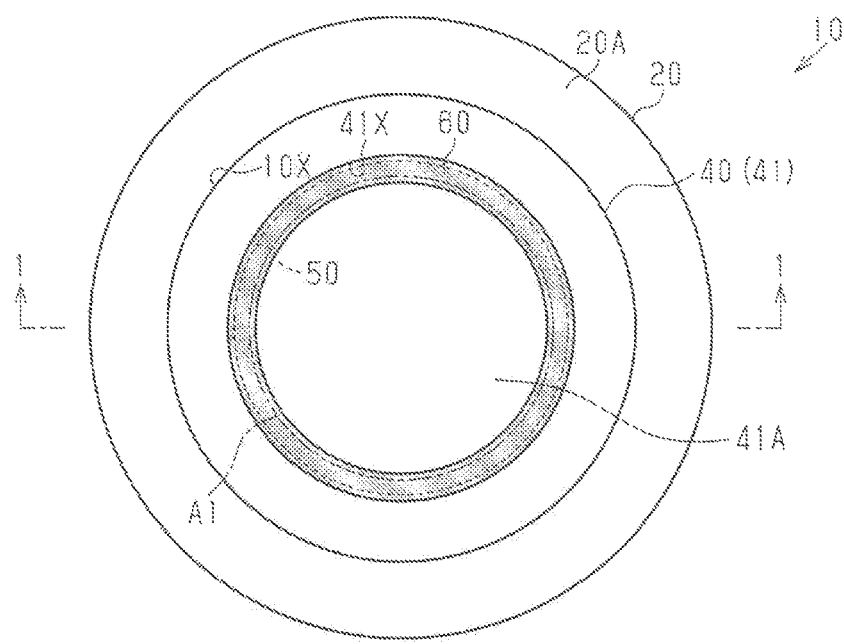
FIG. 2 is a schematic plan view illustrating the electrostatic chuck device of FIG. 1A.

The shape and the size of the base plate 20 are not particularly limited. As illustrated in FIG. 2, the base plate 20 has the shape of, for example, a circular plate in conformance with the shape of a substrate W that is mounted on the electrostatic chuck plate 40. The diameter of the base plate 20 may be, for example, approximately 150 to 500 mm. The thickness of the base plate 20 may be, for example, approximately 10 to 50 mm. In the present specification, "the form of a circular plate" indicates an object having a circular planar shape and a given thickness. "The form of a circular plate" may have any ratio of the thickness to the diameter. Further, "the form of a circular plate" may partially include recesses and projections. In the present specification, the term "plan view" indicates a view of a subject taken in the normal direction of the upper surface 20A of the base plate 20. The term "planar shape" indicates a shape of the subject viewed in the normal direction of the upper surface 20A of the base plate 20.

The material of the base plate 20 may be, for example, a metal material such as aluminum or cemented carbide or a combined material of such metal material and a ceramic material. In the present embodiment, aluminum or an aluminum alloy is used from the viewpoints of obtainability, processability, and a satisfactory thermal conductivity. Additionally, the surface of the base plate 20 has undergone anodizing (insulation layer formation).

Although not illustrated in the drawings, the base plate 20 may be provided with, for example, a gas supply passage used to cool the substrate W and holes for receiving lift pins.

The adhesive layer 30 bonds the electrostatic chuck plate 40 to the upper surface 20A of the base plate 20. The adhesive layer 30 transmits heat from the electrostatic chuck plate 40 to the base plate 20. Thus, the adhesive layer 30 functions as an adhesive agent that bonds the base plate 20 to the electrostatic chuck plate 40 and also functions as a thermal conduction member. The material of the adhesive layer 30 preferably has a high thermal conductivity. For example, a silicone resin may be used as the material of the adhesive layer 30. The thickness of the adhesive layer 30 may be, for example, approximately 0.05 to 2.0 mm.

The electrostatic chuck plate 40 includes a chuck plate body 41, electrostatic electrodes 42, and heating elements 43. The electrostatic electrodes 42 and the heating elements 43 are embedded in the chuck plate body 41. An insulative material may be used as the material of the chuck plate body 41. The material of the chuck plate body 41 may be, for example, a ceramic such as alumina, aluminum nitride, or silicon nitride, or an organic material such as a silicone resin or a polyimide resin. In the present embodiment, alumina is used as the material of the chuck plate body 41 from the viewpoints of obtainability, processability, and relatively high resistance to plasma and the like.

The shape and the size of the chuck plate body 41 (electrostatic chuck plate 40) are not particularly limited. As illustrated in FIG. 2, the chuck plate body 41 (electrostatic chuck plate 40) has, for example, the form of a circular plate in conformance with the shape of the substrate W.

In the present example, as illustrated in FIG. 2, the chuck plate body 41 is circular in a plan view and has, for example, a smaller diameter than the base plate 20. Thus, the chuck plate body 41 has a smaller planar shape than the base plate 20. The chuck plate body 41 is located on a central portion of the upper surface 20A of the base plate 20 in a plan view. Thus, a circumferential portion of the upper surface 20A of the base plate 20 is located outside the chuck plate body 41. The chuck plate body 41 is set to have a larger diameter than the substrate W (refer to FIG. 1). The diameter of the chuck plate body 41 may be, for example, approximately 100 to 450 mm. The thickness of the chuck plate body 41 may be, for example, approximately 1 to 10 mm. FIG. 2 illustrates the focus ring 50 as if it were transparent.

As illustrated in FIG. 1A, the chuck plate body 41 includes an upper surface 41A and an adhesion surface 41B (lower surface in FIG. 1A) located at a side opposite to the upper surface 41A. The upper surface 41A of the chuck plate body 41 includes a mount region A1 on which the substrate W is mounted. The adhesion surface 41B is bonded by the adhesive layer 30 to be parallel to the upper surface 41A.

Although not illustrated in the drawings, the chuck plate body 41 may be provided with, for example, a gas supply passage used to cool the substrate W and holes for receiving lift pins. In the description hereafter, the chuck plate body 41 may be referred to as the electrostatic chuck plate 40.

Each electrostatic electrode 42 is, for example, a thin film electrode. The electrostatic electrodes 42 are embedded in the chuck plate body 41 at positions proximate to the upper surface 41A of the chuck plate body 41. The electrostatic electrodes 42 are electrically connected to an attraction power supply 72. When voltage is applied from the attraction power supply 72, the electrostatic electrodes 42 generate electrostatic force to attract and hold the substrate W, which is an attraction subject, on the upper surface 41A of the chuck plate body 41. This fixes the substrate W to the upper surface 41A. The material of the electrostatic electrodes 42 may be, for example, tungsten (W) or molybdenum (Mo).

The heating elements 43 are embedded in the chuck plate body 41 at positions between the electrostatic electrodes 42 and the adhesion surface 41B. The heating elements 43 are arranged parallel to the upper surface 41A of the chuck plate body 41. The heating elements 43 are electrically connected to a heating power supply 74. The heating elements 43 are controlled so that, for example, the entire substrate W, which is attracted and held to the upper surface 41A, has a uniform temperature. The material of the heating elements 43 may be, for example, tungsten or molybdenum.

A groove 41X extends from the upper surface 41A of the chuck plate body 41 toward the adhesion surface 41B. A bottom wall defining the groove 41X is located at an intermediate position in the thickness-wise direction of the chuck plate body 41. The bottom wall defining the groove 41X is located, for example, at a higher level than the upper surfaces of the electrostatic electrodes 42. The depth of the groove 41X may be, for example, approximately 100 to 200 µm. The thickness of the chuck plate body 41 may be, for example, approximately 250 to 600 µm from the upper surface 41A of the chuck plate body 41 to the upper surfaces of the electrostatic electrodes 42.

The groove 41X is located in a surface of the electrostatic chuck plate 40 (in present example, upper surface 41A of chuck plate body 41) at a portion that corresponds to a region between the focus ring 50 and the mount region A1 of the substrate W in a plan view. In other words, the groove 41X is located in the upper surface 41A of the chuck plate body 41 at a portion that is exposed from a gap between the substrate W, which is mounted on the upper surface 41A of the chuck plate body 41, and the focus ring 50.

Figure 1B:
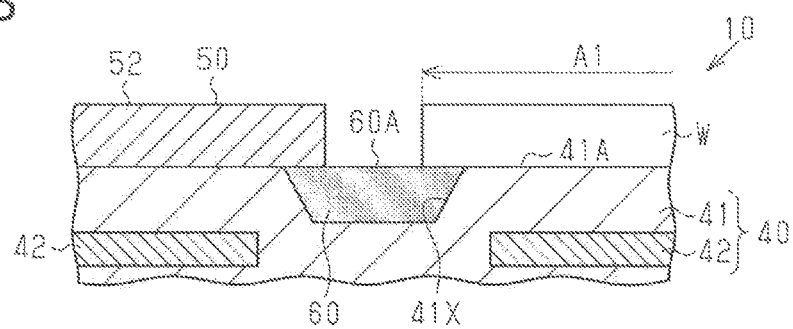
FIG. 1B is a partially enlarged cross-sectional view of the electrostatic chuck device illustrated in FIG. 1A.

As illustrated in FIG. 2, the groove 41X continuously extends throughout a portion of the upper surface 41A that corresponds to an annular region located between an inner edge of the focus ring 50 (refer to broken line in FIG. 2) and an outer edge of the mount region A1 (refer to single-dashed line in FIG. 2) in a plan view. Thus, the groove 41X is annular (ring-shaped) and surrounds the entire outer edge of the mount region A1 in a plan view. In the present example, as illustrated in FIGS. 1B and 2, an outer edge of the groove 41X is located at a position overlapping an inner circumferential portion of the focus ring 50 in a plan view. Additionally, an inner edge of the groove 41X is located at a position overlapping a circumferential portion of the mount region A1 in a plan view.

The width of the groove 41X may be, for example, approximately 2 to 4 mm. The width of a region between the inner edge of the focus ring 50 and the outer edge of the mount region A1 may be, for example, approximately 1 to 2 mm.

As illustrated in FIG. 1B, the groove 41X is located at a position that is separated from the electrostatic electrodes 42 in a plan view. In the present example, a width-wise cross-section of the groove 41X has the form of an inverted trapezoid. The groove 41X includes an upper open end, a bottom wall, and inner wall surfaces. The width of the bottom wall of the groove 41X is smaller than the width of the upper open end of the groove 41X. In other words, in FIG. 1B, the groove 41X is tapered so that the width of the upper open end decreases downward from the upper open end (position proximate to upper surface 41A). Thus, the inner wall surfaces of the groove 41X are inclined from the upper open end of the groove 41X, which is located at the same level as the upper surface 41A so that the width of the bottom wall is smaller than the width of the upper open end.

A protective layer 60 is embedded in the groove 41X. The groove 41X is, for example, filled with the protective layer 60. Thus, the protective layer 60 is located in a region between the focus ring 50 and the mount region A1 in a plan view. In other words, the protective layer 60 covers surfaces (here, inner wall surfaces defining groove 41X) of the chuck plate body 41 that are located in a region between the focus ring 50 and the mount region A1 (substrate W mounted on mount region A1). In the same manner as the groove 41X, the protective layer 60 is annular in a plan view. In the present example, the protective layer 60 includes an outer circumferential portion located at a position overlapping the inner circumferential portion of the focus ring 50 in a plan view. The protective layer 60 includes an inner circumferential portion located at a position overlapping the circumferential portion of the mount region A1 in a plan view. In the present example, the protective layer 60 includes an upper surface 60A, the outer circumferential portion of which is in contact with the inner circumferential portion of the lower surface of the focus ring 50. The inner circumferential portion of the upper surface 60A of the protective layer 60 is in contact with the circumferential portion of the lower surface of the substrate W, which is located on the mount region A1. The upper surface 60A of the protective layer 60 is set to, for example, be flush with (i.e., the same level as) the upper surface 41A of the chuck plate body 41. The upper surface 60A of the protective layer 60 and the upper surface 41A of the chuck plate body 41 are, for example, polished surfaces.

The electrostatic chuck device 10 is installed in, for example, a plasma etching device. When the plasma etching device performs plasma processing using a highly corrosive processing gas, the protective layer 60 protects the chuck plate body 41 from corrosion caused by plasma irradiation. A material having higher plasma resistance than the material (e.g., alumina) forming the chuck plate body 41 may be used for the protective layer 60. The material of the protective layer 60 may be, for example, yttria ($Y_2O_3$) or yttrium aluminum garnet (YAG).

As illustrated in FIG. 1A, in the electrostatic chuck device 10, a step 10X is defined by an outer side surface of the electrostatic chuck plate 40, an outer side surface of the adhesive layer 30, and the circumferential portion of the upper surface 20A of the base plate 20 that is located outside the electrostatic chuck plate 40. The step 10X extends throughout the outer circumference of the electrostatic chuck plate 40. In the present example, the step 10X is annular in a plan view.

The focus ring 50 is fitted to the step 10X. The focus ring 50 is, for example, fastened to the circumferential portion of the upper surface 20A of the base plate 20 that is located outside the electrostatic chuck plate 40 by fastening members (not illustrated) such as bolts or screws. Thus, the focus ring 50 is attached to the base plate 20 in a removable manner.

In the same manner as the step 10X, the focus ring 50 extends along the entire outer circumference of the electrostatic chuck plate 40. The focus ring 50 covers the entire outer side surface of the chuck plate body 41 and a circumferential portion of the upper surface 41A of the chuck plate body 41. However, the shape and the size of the focus ring 50 are not particularly limited as long as it can cover the desired surface of the chuck plate body 41. In the present example, the focus ring 50 is annular (ring-shaped), for example, in conformance with the shape of the step 10X.

The focus ring 50 includes a body 51, which is located on the upper surface 20A of the base plate 20, and a projection 52, which projects inward from an upper inner surface of the body 51. The body 51 and the projection 52 are formed integrally with each other.

The body 51 is annular and covers the entire outer side surface of the chuck plate body 41. The body 51 includes an inner circumferential surface that is in contact with the outer side surface of the chuck plate body 41. The inner diameter of the body 51 is set to be, for example, substantially the same as the outer diameter of the chuck plate body 41. It is preferred that there is no gap between the inner circumferential surface of the body 51 and the outer side surface of the chuck plate body 41. However, in this specification, the term "no gap" means that two opposing surfaces having the same shape are in contact with each other and that there may be a subtle gap between the two opposing surfaces that results from the processing accuracy or the like. The outer diameter of the body 51 is set to be, for example, substantially the same as the outer diameter of the base plate 20.

The projection 52 projects from the upper inner circumferential surface of the body 51 toward the center (mount region A1) of the chuck plate body 41 to cover the circumferential portion of the upper surface 41A of the chuck plate body 41. Thus, the projection 52 is annular (ring-shaped). The projection 52 includes a lower surface that is in contact with the circumferential portion of the upper surface 41A of the chuck plate body 41. The thickness of the focus ring 50 from the lower surface of the projection 52 to the lower surface of the body 51 is set to be substantially the same as the total thickness of the adhesive layer 30 and the chuck plate body 41. It is preferred that there is no gap between the lower surface of the projection 52 and the upper surface 41A of the chuck plate body 41.

The inner diameter of the projection 52 is set to be larger than the outer diameter of the substrate W, which is mounted on the mount region A1. Thus, the mount region A1 is exposed from the focus ring 50 at an inner side of the projection 52. As illustrated in FIG. 1B, the projection 52 includes an inner circumferential portion (end) located at a position overlapping the outer edge of the groove 41X and the protective layer 60 in a plan view. The lower surface of the projection 52 includes an inner circumferential portion that is in contact with the outer circumferential portion of the upper surface 60A of the protective layer 60. The thickness of the projection 52 is set to be, for example, substantially the same as the thickness of the substrate W. The thickness of the projection 52 may be, for example, approximately 0.5 to 1 mm.

For example, a material having higher plasma resistance than the material of the electrostatic chuck plate 40 may be used for the focus ring 50. The material of the focus ring 50 may be, for example, silicon, quartz, ceramic, a fluorine resin, or the like.

A method for manufacturing the electrostatic chuck device 10 will now be described.

Figure 3A:
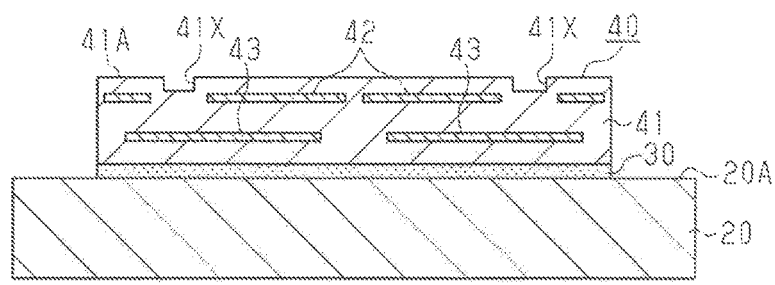
FIGS. 3A to 3D, 4A, and 4B are schematic cross-sectional views illustrating a method for manufacturing the electrostatic chuck device of FIG. 1A.

As illustrated in FIG. 3A, the base plate 20 and the electrostatic chuck plate 40, which incorporates the electrostatic electrodes 42 and the heating elements 43, are prepared. The base plate 20 and the electrostatic chuck plate 40 are each manufactured through a known manufacturing process, which will not be described in detail. For example, after performing printing by applying tungsten to green sheets and stacking the green sheets, the stack of the green sheets is baked to form the electrostatic chuck plate 40. The electrostatic chuck plate 40 is bonded to the upper surface 20A of the base plate 20 by the adhesive layer 30.

Figure 3B:
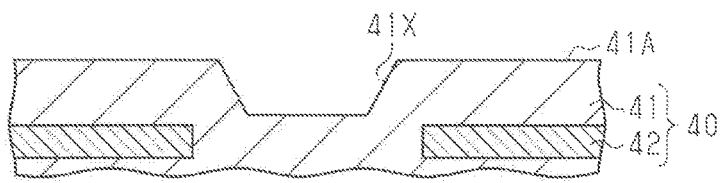

In the step of FIG. 3A, the groove 41X is formed in a predetermined portion of the upper surface 41A of the chuck plate body 41. The groove 41X may be formed, for example, through machining or laser processing. In the present example, as illustrated in FIG. 3B, the groove 41X is formed so that the inner wall surfaces of the groove 41X are inclined inward from the upper open end of the groove 41X and so that the width of the bottom wall of the groove 41X is smaller than the width of the upper open end. The groove 41X may be formed before or after the electrostatic chuck plate 40 is bonded to the base plate 20 (refer to FIG. 3A).

Figure 3C:
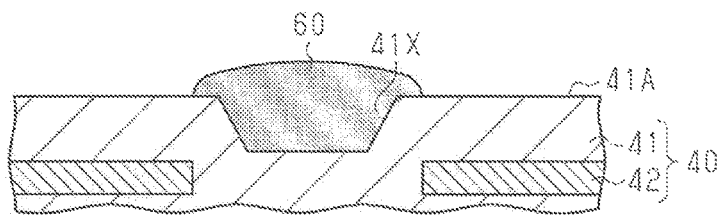
Figure 3D:
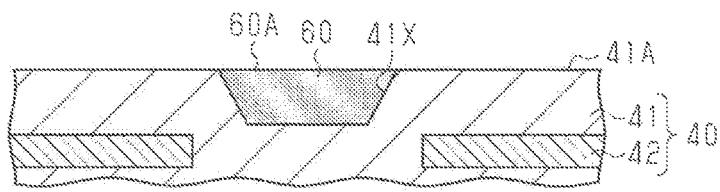

In the steps of FIGS. 3C and 3D, the groove 41X is filled with the material of the protective layer 60. In the step of FIG. 3C, for example, yttria is thermally sprayed to the groove 41X to fill the groove 41X with yttria. Consequently, the inner wall surfaces defining the groove 41X are covered by the protective layer 60. In the thermal spraying step, a spray material (here, yttria) is heated by combustion energy or electrical energy to obtain molten or semi-molten particles. The particles are struck against the inner wall surfaces defining the groove 41X at a high speed to form a thermal spray coating (protective layer 60). The thermal spraying may be gas-type flame spraying, electric type arc spraying, electric type plasma spraying, or the like. The process for forming the protective layer 60 is not limited to thermal spraying and may be cold spraying, an aerosol deposition process, sintering, or the like.

The protective layer 60 that projects from the upper surface 41A of the chuck plate body 41 is polished and flattened. Consequently, as illustrated in FIG. 3D, the upper surface 41A of the chuck plate body 41 is substantially flush with the upper surface 60A of the protective layer 60. The protective layer 60 may be polished, for example, through mechanical polishing, chemical mechanical polishing (CMP), or the like.

Figure 4A:
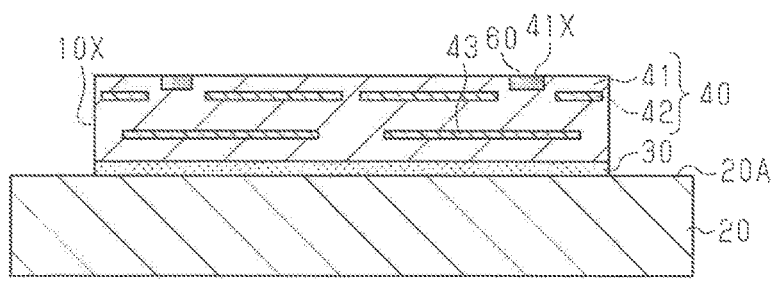

Through the above manufacturing steps, as illustrated in FIG. 4A, the protective layer 60 is embedded in the groove 41X of the electrostatic chuck plate 40, which is bonded to the upper surface 20A of the base plate 20 by the adhesive layer 30. Additionally, the ring-shaped step 10X, which extends along the circumference of the electrostatic chuck plate 40, is defined by the outer side surface of the electrostatic chuck plate 40, the outer side surface of the adhesive layer 30, and the circumferential portion of the upper surface 20A of the base plate 20.

Figure 4B:
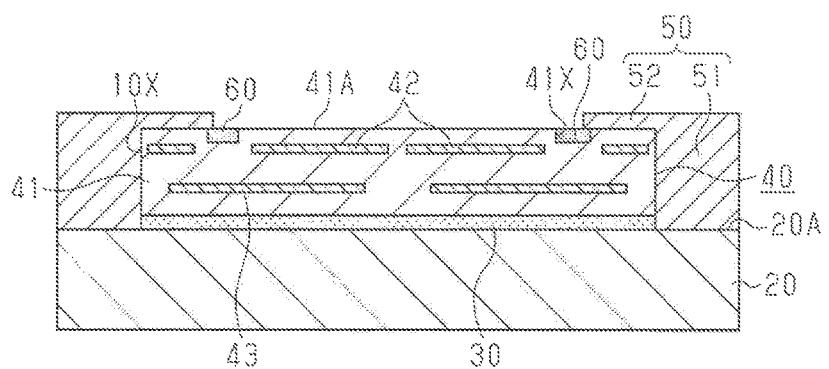

In the step of FIG. 4B, the focus ring 50 is fitted to the step 10X. The focus ring 50 is fixed to the circumferential portion of the upper surface 20A of the base plate 20 that is located outside the electrostatic chuck plate 40 by fastening members (not illustrated) such as bolts. The focus ring 50 covers the entire outer side surface of the electrostatic chuck plate 40, the entire outer side surface of the adhesive layer 30, the circumferential portion of the upper surface 41A of the electrostatic chuck plate 40, and the outer circumferential portion of the upper surface 60A of the protective layer 60. The manufacturing steps described above manufacture the electrostatic chuck device 10.

The present embodiment has the advantages described below.

(1) The groove 41X is located in the upper surface 41A of the electrostatic chuck plate 40 (chuck plate body 41) at a portion that corresponds to a region between the focus ring 50 and the mount region A1. The groove 41X is filled with the protective layer 60. The protective layer 60 limits plasma irradiation of the upper surface 41A of the electrostatic chuck plate 40. Thus, even when a plasma processing is repeatedly performed on the substrate W, which is attracted to and held on the electrostatic chuck device 10, using a highly corrosive fluorine or chlorine processing gas, the corrosion of the electrostatic chuck plate 40 caused by the plasma irradiation may be limited. This limits the shortening of the life of the electrostatic chuck plate 40 and ultimately the life of the electrostatic chuck device 10.

The protective layer 60, which is irradiated with plasma, is formed from a material having higher plasma resistance than the material of the electrostatic chuck plate 40. This limits the corrosion of the protective layer 60 caused by the plasma irradiation.

(2) The groove 41X is filled with the protective layer 60 that is formed from a material differing from the material of the electrostatic chuck plate 40. Thus, even when the protective layer 60 is corroded by the plasma irradiation, a new protective layer 60 may be easily formed in the groove 41X. For example, the protective layer 60 that has been corroded by the plasma irradiation may be removed from the groove 41X. Then, a new protective layer 60 may be easily formed in the groove 41X. The new protective layer 60 protects the electrostatic chuck plate 40 from the erosion caused by the plasma irradiation. The repetitive replacement of the protective layer 60 to protect the electrostatic chuck plate 40 significantly extends the life of the electrostatic chuck device 10.

Figure 7:
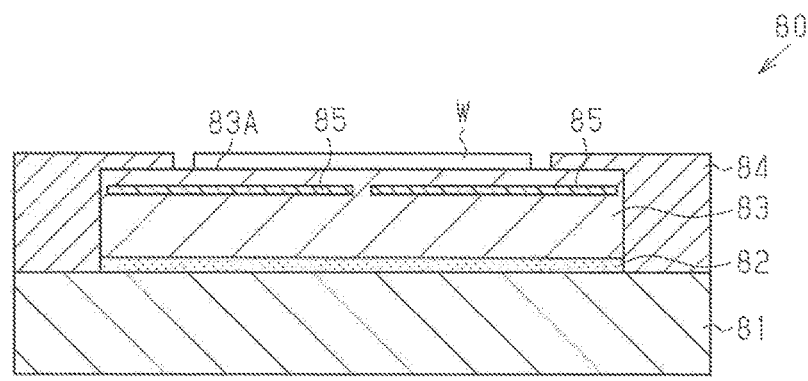
FIG. 7 is a schematic cross-sectional view of an electrostatic chuck device in the related art.

(3) In the related art of FIG. 7, the attraction surface 83A of the electrostatic chuck plate 83 that has been corroded by plasma irradiation may be polished to extend the life of the electrostatic chuck device 80. Such a polishing process stabilizes the attraction force but reduces the thickness of the electrostatic chuck plate 83. Thus, the height of the focus ring 84 needs to be adjusted. Additionally, when the attraction surface 83A is polished, the electrostatic chuck plate 83 is thinned between the attraction surface 83A and the electrostatic electrodes 85. This lowers the withstanding voltage of the electrostatic chuck plate 83.

In this regard, in the present embodiment, the electrostatic chuck plate 40 is protected by the protective layer 60 formed from a material that differs from the material of the electrostatic chuck plate 40. Thus, when the protective layer 60 is corroded, the protective layer 60 may be solely replaced. In this case, the thickness of the electrostatic chuck plate 40 substantially does not change even when the protective layer 60 is repeatedly replaced. This eliminates the need for adjusting the height of the focus ring 50. Also, the withstanding voltage of the electrostatic chuck plate 83 will not be lowered.

(4) The protective layer 60 is located in the groove 41X. Thus, the protective layer 60 may be easily increased in thickness as compared to when the protective layer 60 is located on the upper surface 41A of the chuck plate body 41. This improves the withstanding voltage of the protective layer 60 and also the resistance of the electrostatic chuck device 10 with respect to plasma corrosion. Additionally, enlargement of the electrostatic chuck device 10 resulting from the formation of the protective layer 60 may be limited.

(5) The groove 41X is located at a position that is separated from the electrostatic electrodes 42 in a plan view. This allows the groove 41X to be deeply formed. Thus, the protective layer 60 may be further increased in thickness. This further improves the withstanding voltage of the protective layer 60 and also the resistance of the electrostatic chuck device 10 with respect to plasma corrosion.

(6) The inner wall surfaces of the groove 41X are inclined from the upper open end of the groove 41X toward an inner side of the groove 41X so that the width of the bottom wall of the groove 41X is smaller than the width of the upper open end. This increases the contact area between the inner wall surfaces defining the groove 41X and the protective layer 60. Thus, the adhesiveness is improved between the chuck plate body 41 and the protective layer 60. Further, cracks in the edge of the electrostatic chuck plate 40 that defines the upper open end of the groove 41X are limited when polishing the protective layer 60 or the like.

(7) The outer circumferential portion of the protective layer 60 is located at a position overlapping the inner circumferential portion of the projection 52 of the focus ring 50 in a plan view. Thus, even when the position of the inner circumferential portion of the focus ring 50 is deviated from the intended position due to a manufacturing error or the like, the protective layer 60 covers the upper surface 41A of the electrostatic chuck plate 40 that is exposed from a gap between the focus ring 50 and the substrate W.

(8) The inner circumferential portion of the protective layer 60 is located at a position overlapping the circumferential portion of the mount region A1 in a plan view. Thus, even when the substrate W is displaced from the mount region A1, the protective layer 60 covers the upper surface 41A of the electrostatic chuck plate 40 that is exposed from the gap between the focus ring 50 and the substrate W.

Second Embodiment

A second embodiment will now be described with reference to FIG. 5. The second embodiment differs from the first embodiment in that an electrostatic chuck device 10A includes an electrostatic chuck plate 40A having a structure differing from the electrostatic chuck plate 40. The description will focus on the differences from the first embodiment. The same reference characters are given to elements that are the same as the corresponding elements illustrated in FIGS. 1A to 4D. Such elements will not be described in detail.

Figure 5:
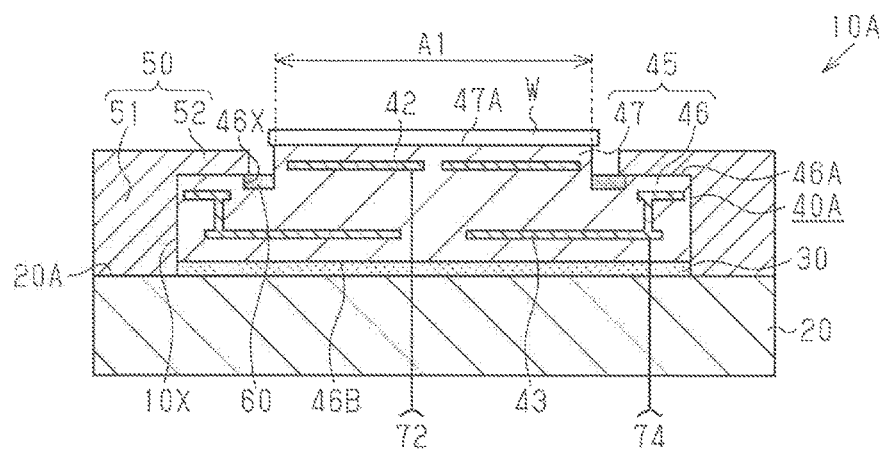
FIG. 5 is a schematic cross-sectional view illustrating a second embodiment of an electrostatic chuck device.

As illustrated in FIG. 5, the electrostatic chuck plate 40A includes a chuck plate body 45, electrostatic electrodes 42, and heating elements 43. The electrostatic electrodes 42 and the heating elements 43 are embedded in the chuck plate body 45.

The chuck plate body 45 includes a body 46, which is bonded to the upper surface 20A of the base plate 20 by the adhesive layer 30, and a holding base 47, which projects upward from an upper surface 46A of the body 46 and has a smaller planar shape than the body 46.

The shape and the size of the body 46 and the holding base 47 are not particularly limited. The body 46 and the holding base 47 each have the form of, for example, a circular plate in conformance with the shape of the substrate W. The diameter of the body 46 is set to be smaller than the diameter of the base plate 20. The diameter of the holding base 47 is set to be smaller than the diameter of the body 46. Thus, the chuck plate body 45 includes a step formed by an outer side surface of the holding base 47 and the upper surface 46A of the body 46. In the present example, the diameter of the holding base 47 is set to be smaller than the diameter of the substrate W.

The body 46 includes the upper surface 46A and an adhesion surface 46B (in FIG. 5, lower surface), which is located at a side opposite to the upper surface 46A and bonded by the adhesive layer 30. The holding base 47 includes an upper surface 47A, on which the substrate W is mounted. In the present example, the entire upper surface 47A of the holding base 47 serves as the mount region A1.

The electrostatic electrodes 42 are embedded in the holding base 47. In the present example, the electrostatic electrodes 42 are embedded in the holding base 47 at a position proximate to the upper surface 47A of the holding base 47. The heating elements 43 are embedded, for example, in the body 46.

A groove 46X extends from the upper surface 46A of the body 46 toward the adhesion surface 46B. A bottom wall defining the groove 46X is located at an intermediate position in the thickness-wise direction of the body 46. In the present example, the bottom wall defining the groove 46X is located toward the upper side from the upper surfaces of the heating elements 43.

The groove 46X is located in a surface (in present example, upper surface 46A of body 46) of the electrostatic chuck plate 40 at a portion that corresponds to a region between the focus ring 50 and the mount region A1 (in present example, upper surface 47A of holding base 47) in a plan view. In other words, the groove 46X is located in the upper surface 46A of the body 46 at a portion that is exposed from a gap between the focus ring 50 and an outer side surface of the holding base 47.

In the present example, the groove 46X continuously extends throughout a portion of the upper surface 46A that corresponds to an annular region located between the inner circumferential portion (inner edge of projection 52) of the focus ring 50 and the outer side surface of the holding base 47 in a plan view. Thus, the groove 46X is annular (ring-shaped) and surrounds the entire outer circumference (outer side surface) of the holding base 47 in a plan view. The groove 46X is located at a position that is separated from the electrostatic electrodes 42 in a plan view. In the present example, the outer edge of the groove 46X is located at a position overlapping the inner circumferential portion of the projection 52 in a plan view. The groove 46X includes an inner wall that is, for example, continuous with the outer side surface of the holding base 47.

The protective layer 60 is embedded in the groove 46X. The groove 46X is, for example, filled with the protective layer 60. Thus, the protective layer 60 is located in a region between the projection 52 of the focus ring 50 and the outer side surface of the holding base 47 in a plan view. In other words, the protective layer 60 covers surfaces (here, inner wall surfaces defining groove 46X) of the body 46 that are located in the region between the projection 52 of the focus ring 50 and the outer side surface of the holding base 47. The outer circumferential portion of the protective layer 60 is located at a position overlapping the inner circumferential portion of the projection 52 in a plan view. In the present example, the outer circumferential portion of the upper surface 60A of the protective layer 60 is in contact with the inner circumferential portion of the lower surface of the projection 52.

In the electrostatic chuck device 10A, the step 10X is defined by the outer side surface of the body 46, the outer side surface of the adhesive layer 30, and the circumferential portion of the upper surface 20A of the base plate 20 that is located outside the body 46.

The focus ring 50 is fitted to the step 10X. The focus ring 50 covers the entire outer side surface of the body 46 and the circumferential portion of the upper surface 46A of the body 46. In the present example, the body 51 of the focus ring 50 is annular and covers the entire outer side surface of the body 46. The inner circumferential surface of the body 51 is in contact with the outer side surface of the body 46. The projection 52 of the focus ring 50 is annular (ring-shaped) and projects from the upper inner surface of the body 51 toward the center (holding base 47) of the body 46 to cover the circumferential portion of the upper surface 46A of the body 46. The lower surface of the projection 52 is in contact with the circumferential portion of the upper surface 46A of the body 46.

The second embodiment has the same advantages as the first embodiment.

It should be apparent to those skilled in the art that the foregoing embodiments may be employed in many other specific forms without departing from the scope of this disclosure. Particularly, it should be understood that the foregoing embodiments may be employed in the following forms.

Figure 6:
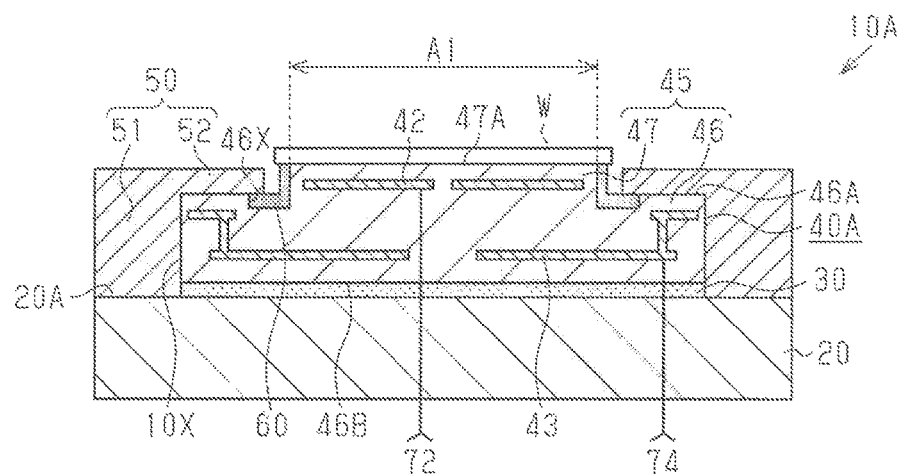
FIG. 6 is a schematic cross-sectional view illustrating a modified example of an electrostatic chuck device.

As illustrated in FIG. 6, in the electrostatic chuck device 10A of the second embodiment, the protective layer 60 may be formed to cover the outer side surface of the holding base 47. In this modified example, the protective layer 60 fills the groove 46X and also covers the entire outer side surface of the holding base 47. In this structure, the protective layer 60 covers the outer side surface of the holding base 47 that is exposed from a gap between the focus ring 50 and the substrate W (holding base 47). This limits corrosion of the outer side surface of the holding base 47 caused by the plasma irradiation.

In the second embodiment, the diameter of the holding base 47 may be set to be larger than or substantially the same as the diameter of the substrate W. When the diameter of the holding base 47 is set to be larger than the diameter of the substrate W, it is preferred, for example, that a further groove is formed in a circumferential portion of the upper surface 47A of the holding base 47 located outside the substrate W. Inner wall surfaces defining the groove are covered by a further protective layer. In this case, the further groove may be formed, for example, in the same manner as the groove 41X of the first embodiment. The further protective layer may be formed, for example, in the same manner as the protective layer 60 of the first embodiment.

The grooves 41X, 46X of the above embodiments may each have any cross-sectional shape taken in the width-wise direction. The width-wise cross-sectional shape of the groove 41X may be, for example, semicircular, semielliptical, or rectangular. Also, the width-wise cross-sectional shape of the groove 46X may be trapezoidal, semicircular, semielliptical, or rectangular.

Clauses

This disclosure encompasses the following embodiments.

1. A method for manufacturing an electrostatic chuck device, the method including:

coupling an electrostatic chuck plate to an upper surface of a base plate, wherein the electrostatic chuck plate includes a mount region on which an attraction subject is mounted;

forming a groove in the electrostatic chuck plate;

filling the groove with a protective layer, wherein the protective layer is formed from a material having a higher plasma resistance than a material forming the electrostatic chuck plate; and fastening a focus ring to the upper surface of the base plate, wherein the focus ring covers an outer side surface of the electrostatic chuck plate and a portion of an upper surface of the electrostatic chuck plate;

wherein the groove is located in the upper surface of the electrostatic chuck plate at a portion that corresponds to a region between the focus ring and the mount region in a plan view.

2. The method according to clause 1, wherein the filling the groove with a protective layer includes forming the protective layer in the groove through one of a thermal spraying process, a cold spraying process, an aerosol deposition process, and a sintering process, and polishing a portion of the protective layer that projects upward from the upper surface of the electrostatic chuck plate.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. An electrostatic chuck device comprising:

a base plate;

an electrostatic chuck plate coupled to an upper surface of the base plate and including a mount region on which an attraction subject is mounted;

an electrostatic electrode embedded in the electrostatic chuck plate;

a focus ring located on the upper surface of the base plate, wherein the focus ring covers an outer side surface of the electrostatic chuck plate and a portion of an upper surface of the electrostatic chuck plate;

a groove located in the upper surface of the electrostatic chuck plate at a portion that corresponds to a region between the focus ring and the mount region in a plan view; and a protective layer with which the groove is filled, wherein the groove is located at a position separated from the electrostatic electrode in a plan view, and the protective layer is formed from a material having a higher plasma resistance than a material forming the electrostatic chuck plate.

2. The electrostatic chuck device according to claim 1, wherein the groove includes an upper open end, a bottom wall, and an inner wall surface, the upper open end is a same level as the upper surface of the electrostatic chuck plate, and the inner wall surface is inclined from the upper open end of the groove so that the width of the bottom wall is smaller than the width of the upper open end.

3. The electrostatic chuck device according to claim 1, wherein
the protective layer includes an outer circumferential portion,
the focus ring includes an inner circumferential portion, and
the outer circumferential portion of the protective layer is located at a position overlapping the inner circumferential portion of the focus ring in a plan view.

4. The electrostatic chuck device according to claim 1, further comprising a step defined by the outer side surface of the electrostatic chuck plate and the upper surface of the base plate located outside the electrostatic chuck plate, wherein
the step extends along an outer circumference of the electrostatic chuck plate,
the focus ring is fitted to the step and covers the entire outer side surface of the electrostatic chuck plate and a circumferential portion of the upper surface of the electrostatic chuck plate, and
the groove is located in the upper surface of the electrostatic chuck plate at a portion corresponding to a region between an inner edge of the focus ring on the upper surface of the electrostatic chuck plate and an outer edge of the mount region in a plan view.

5. The electrostatic chuck device according to claim 4, wherein
the protective layer includes an inner circumferential portion,
the mount region includes an outer circumferential portion, and
the inner circumferential portion of the protective layer is located at a position overlapping the outer circumferential portion of the mount region in a plan view.

6. The electrostatic chuck device according to claim 1, wherein
the electrostatic chuck plate includes
a body bonded to the base plate by an adhesive layer, and
a holding base that projects upward from an upper surface of the body and is smaller than the body in a plan view, wherein the holding base includes an upper surface that entirely serves as the mount region,
the electrostatic chuck device further comprises a step that is defined by an outer side surface of the body and the upper surface of the base plate located outside the body, wherein
the step extends along an outer circumference of the body,
the focus ring is fitted to the step and covers the entire outer side surface of the body and a circumferential portion of the upper surface of the body, and
the groove is located in the upper surface of the body at a portion corresponding to a region between an inner edge of the focus ring on the upper surface of the body and an outer side surface of the holding base in a plan view.

7. The electrostatic chuck device according to claim 6, wherein the protective layer covers the outer side surface of the holding base.

8. The electrostatic chuck device according to claim 1, wherein the protective layer covers the upper surface of the electrostatic chuck plate exposed in the region between the focus ring and the mount region.

* * * * *